(12) United States Patent
Yeager et al.

(10) Patent No.: US 6,507,049 B1
(45) Date of Patent: Jan. 14, 2003

(54) ENCAPSULANTS FOR SOLID STATE DEVICES

(75) Inventors: Gary William Yeager, Schenectady, NY (US); Malgorzata Rubinsztajn, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 4 days.

(21) Appl. No.: 09/654,830

(22) Filed: Sep. 1, 2000

(51) Int. Cl.[7] ............................................... H01L 33/00
(52) U.S. Cl. ...................... 257/100; 257/433; 257/788; 257/789; 257/792; 257/793
(58) Field of Search ................... 257/100, 433, 257/788, 789, 792, 793–795

(56) References Cited

U.S. PATENT DOCUMENTS

| | | | |
|---|---|---|---|
| 4,178,274 A | 12/1979 | Denk et al. | 260/31.8 |
| 4,336,367 A | 6/1982 | Morris et al. | 524/770 |
| 4,454,201 A * | 6/1984 | Uram, Jr. | 428/413 |
| 5,101,264 A * | 3/1992 | Kauchi et al. | 357/72 |
| 5,145,889 A * | 9/1992 | Wada et al. | 523/451 |
| 5,198,479 A | 3/1993 | Shiobara et al. | 523/214 |

FOREIGN PATENT DOCUMENTS

| | | |
|---|---|---|
| JP | 08319343 A * | 12/1996 |
| JP | 08325361 A * | 12/1996 |

* cited by examiner

Primary Examiner—Nathan J. Flynn
Assistant Examiner—Remmon R. Fordé
(74) Attorney, Agent, or Firm—S. Bruce Brown; Noreen C. Johnson (57) ABSTRACT

A packaged solid state device having a package, a chip, and an encapsulate having an epoxy resin, a boron containing catalyst that is essentially free of halogen. A LED device having a package, a LED chip, a encapsulate having a cycloaliphatic epoxy resin and a boroxine catalyst essentially free of halogen. A method of encapsulating a solid state device whereby a solid state device is placed into a package, and an encapsulant comprising an epoxy resin, and a boron containing catalyst that is essentially free of halogen, are provided.

65 Claims, 3 Drawing Sheets

ENCAPSULANTS FOR SOLID STATE DEVICES

FIELD OF THE INVENTION

This invention relates to solid state device packaging and specifically to an encapsulating material for a LED. It also relates to a method of encapsulating a solid state device, particularly a LED.

DESCRIPTION OF THE RELATED ART

Light transmissive resins for encapsulating semiconductor devices have heavily relied on blends of bisphenol-A epoxy and aliphatic anhydride curing agents. As described in U.S. Pat. No. 4,178,274, to Denk et al., "one disadvantage of epoxy casting resin compounds based on bisphenol A/acid anhydride, which harden fast through the use of known accelerators such as tertiary amines, imidazoles or boron trifluoride complexes, is their poor thermal aging stability. The materials used heretofore become discolored in extended storage at temperatures above 80° C., through yellow to brown, whereby their light transmittancy decreases considerably." Furthermore, because of the aromatic character of bisphenol-A based epoxy resins, these encapsulants would be less stable to ultraviolet radiation. Therefore, these materials may tend to degrade on extended exposure to light having an ultraviolet component. Such degradation can lead to discoloration of the encapsulant, and accordingly reduced light transmittance.

To circumvent these issues, Denk et al. describe casting resin compositions for the sealing of opto-electronic components. These resins comprise (i) at least one cycloaliphatic epoxy having at least two oxirane rings, (ii) a carbonic acid anhydride, (iii) zinc octoate, and (iv) a solvent selected from the group consisting of a low molecular weight polyol, a low molecular weight ester and mixtures thereof. The inventors of the present invention have calculated the weight of epoxy resin to be at most 46%.

Wada et al. in U.S. Pat. No. 5,145,889 describe a composition comprising (i) 100 parts by weight of an epoxy resin, (ii) 70 to 140 parts by weight of a curing agent including an acid anhydride, (iii) 0.5 to 4.0 parts by weight of a curing accelerator including an onium or diazabicycloalkene salt, (iv) 0.5 to 5.0 parts by weight of a phosphorus triphosphite, and (v) 0.5 to 5.0 parts by weight of a silane coupling agent. The inventors of the present application have calculated the epoxy resin of Wada to be at most 58% epoxy resin by weight.

The inventors of the present invention have found that addition of such high levels of curing agents can lead to color formation in thermally cured resins, thereby reducing the overall transmittance of the light emitting diode. Because the typical process for the production of a LED involves casting of an;uncured epoxy resin around the LED device followed by thermally curing the epoxy, such thermal discoloration is undesirable. Whereas UV curable epoxy resins can be formulated to provide compositions with levels of epoxy above 76%, such materials are not desirable for processes involving thermal cure. Furthermore, materials such as diaryliodonium salts are known to produce high colors upon cure.

Uram et al. in U.S. Pat. No. 4,454,201 describe a multi-layered transparency composite for use in military and industrial hardware, such as windows for military helicopters. The transparency composite has a blend of (i) from about 80 to about 100 parts by weight of an epoxy resin, (ii) from about 5 to about 30 parts by weight of a boroxine, such as trimethoxyboroxine, (iii) from about 1 part to about 40 parts by weight of an organic phosphorus compound, that is contiguously contacting at least one layer of a composition resistant to moisture permeation, which comprises (iv) 100 parts by weight of a mercaptan resin, (v) 40 to about 250 parts by weight of an epoxy resin, and (vi) from about 0.5 parts by weight to about 4.0 parts by weight of a silane coupling agent.

Morris et al. in U.S. Pat. No. 4,336,367 describe an adhesive composition for clandestinely attaching ordnance devices to the bottom of ships. This composition comprises a mixture of a (i) 3,4-epoxycyclohexylalkyl 3,4-epoxycyclohexanecarboxylate, exo-exo bis(2,3-epoxycyclopentyl) ether, endo-exo bis(2,3-epoxycyclopentyl) ether and (ii) a trialkoxyboroxine. The compositions are developed for underwater adhesive applications for use in naval warfare. There is no disclosure given for the use of such compositions for encapsulation of solid-state devices such as LEDs.

SUMMARY OF THE INVENTION

In accordance with one aspect of the present invention, there is provided a packaged solid state device comprising a package, a chip, and an encapsulant comprising an epoxy resin, and a boron-containing catalyst that is essentially free of halogen.

In accordance with another aspect of the present invention, there is provided a LED device comprising a package, a LED chip, and an encapsulant comprising a cycloaliphatic epoxy resin, and a boroxine catalyst that is essentially free of halogen.

In accordance with another aspect of the present invention, there is provided a method of encapsulating a solid state device comprising placing a solid state device into a package, and providing an encapsulant comprising an epoxy resin and a boron containing catalyst that is essentially free of halogen.

In accordance with yet another aspect of the present invention, there is provided a LED device comprising a package, a LED chip, and an encapsulant comprising a cycloaliphatic epoxy resin from about 76% to about 99% by weight of the encapsulant, a boroxine catalyst from about 1% to about 24% by weight of the encapsulant, wherein the catalyst is essentially free of halogen, and a thermal stabilizer.

In accordance with another aspect of the present invention, there is provided a LED device comprising a package, a LED chip; and an encapsulant comprising a cycloaliphatic epoxy resin from about 76% to about 99% by weight of the encapsulant; and a curing agent or catalyst, from about 1% to about 24% by weight of the encapsulant, wherein the curing agent or catalyst is essentially free of halogen.

DETAILED DESCRIPTION OF THE PREFERRED EMBODIMENTS

The inventors of the present invention have determined that it is desirable to increase the percent weight of epoxy resin for the production of encapsulants with low absorption in the visible color range, especially for blue light, which includes light of wavelengths between about 400 nm and about 450 nm. However, if the percent weight of epoxy resin is increased, the percent weight of curing agent, such as anhydride, is then correspondingly reduced. This reduction of curing agent requires higher temperatures and/or longer melt times to cure the epoxy resin. Longer cure times or higher temperatures can cause undesirable discoloration. The present invention overcomes this difficulty by using an curing agent that can be used in small quantities without causing discoloration of the epoxy encapsulant. The present invention advantageously allows thermally cured epoxy resins to be used as encapsulants without discoloration, especially for visible light LEDs and most particularly blue light LEDs.

Curable compositions of the present invention comprise an epoxy resin, which is preferably cycloaliphatic or aliphatic, and preferably a boron cure accelerator or catalyst that is essentially free of halogen, and more preferably boroxine. Additional additives that may be used with the compositions of the present invention include thermal stabilizers, UV stabilizers, siloxane coupling agents, cure inhibitors and fillers. One or more of these additives can be used. In a preferred embodiment, the epoxy component comprises a cycloaliphatic epoxy resin. The use of these compositions for encapsulation of solid state devices provides unexpected advantages, such as improved thermal and UV stability.

In a preferred embodiment, the encapsulant is of about 76% to about 99% by weight of an epoxy resin and from about 1% to about 24% by weight of a curing agent or curing catalyst. The levels of the cure catalyst or curing agent are reduced relative to the anhydride curing agent typically used for epoxy resin encapsulants, which is generally from about 40% to about 75% by weight of the final composition. In another preferred embodiment, the encapsulant is from about 85% to about 99% by weight of an epoxy resin and from about 1% to about 15% by weight of a curing agent or curing catalyst.

The compositions of the present invention preferably include those containing borate or boroxine, and preferably trialkoxyboroxine catalysts, and may further comprise supplemental cure inhibitors, coupling agents, stabilizers, flexibilizers, and inorganic-organic additives to modify optical, electronic or mechanical properties of the system. One preferred embodiment of the aforementioned compositions is one which comprises (1) a cycloaliphatic epoxy resin, (2) boroxine cure accelerator, and optionally (3) a cure inhibitor, (4) a phosphite stabilizer, (5) a siloxane coupling agent, and (6) a refractive index modifier. The components of this invention are described in more detail below.

Epoxy Resins

Epoxy resins useful in the encapsulant of present invention include those described in "Chemistry and Technology of the Epoxy Resins," B. Ellis (Ed.) Chapman Hall 1993, New York and "Epoxy Resins Chemistry and Technology," C. May and Y. Tanaka, Marcell Dekker 1972, New York, both incorporated herein by reference. Epoxy resins that can be used for the present invention include those that could be produced by reaction of a hydroxyl, carboxyl or amine containing compound with epichlorohydrin, preferably in the presence of a basic catalyst, such as a metal hydroxide, for example sodium hydroxide. Also of included are epoxy resins produced by reaction of a compound containing at least one and preferably two or more carbon-carbon double bonds with a peroxide, such as a peroxyacid.

Preferred epoxy resins for the present invention are cycloaliphatic and aliphatic epoxy resins. Aliphatic epoxy resins include compounds that contain at least one aliphatic group and at least one epoxy group. Examples of aliphatic epoxies include, butadiene dioxide, dimethylpentane dioxide, diglycidyl ether, 1,4-butanedioldiglycidyl ether, diethylene glycol diglycidyl ether, and dipentene dioxide.

Cycloaliphatic epoxy resins are well known to the art and, as described herein, are compounds that contain at least about one cycloaliphatic group and at least one oxirane group. More preferred cycloalipahtic epoxies are compounds that contain about one cycloaliphatic group and at least two oxirane rings per molecule. Specific examples include 2-(3,4-epoxy)cyclohexyl-5,5-spiro-(3,4-epoxy) cyclohexane-m-dioxane, 3,4-epoxycyclohexylalkyl-3,4-epoxycyclohexanecarboxylate, 3,4-epoxy-6-methylcyclohexylmethyl-3,4-epoxy-6-methylcyclohexanecarboxylate, vinyl cyclohexanedioxide, bis(3,4-epoxycyclohexylmethyl)adipate, bis(3,4-epoxy-6-methylcyclohexylmethyl)-adipate, exo-exo bis(2,-3-epoxycyclopentyl) ether, endo-exo bis(2,3-epoxycyclopentyl) ether, 2,2-bis(4-(2,3-epoxypropoxy) cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)hexahydro-4, 7-methanoindane, p(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy) cyclopentylphenyl-2,3-epoxy-propyl ether), 1,2-bis(5-(1,2-epoxy)-4,7-hexahydromethanoindanoxyl)ethane, cyclopentenylphenyl glycidyl ether, cyclohexanediol diglycidyl ether, and diglycidyl hexahydrophthalate.

Most preferred cycloaliphatic epoxy resins are 3,4-epoxycyclohexylmethyl-3,4-epoxycyclohexanecarboxylate, and 3,4-epoxy-6-methylcyclohexylmethyl-3,4-epoxy-6-methylcyclohexanecarboxylate.

Aromatic epoxy resins may also be used with the present invention, but are not as advantageous as cycloaliphatic and aliphatic compounds, due to the greater tendency of aromatic resins to discolor. Additives such as thermal stabilizers or antioxidants may be used with aromatic epoxy resins to lessen discoloring. Examples of epoxy resins useful in the present invention include bisphenol-A epoxy resins, bisphenol-F epoxy resins, phenol novolac epoxy resins, cresol-novolac epoxy resins, biphenol epoxy resins, biphenyl epoxy resins, 4,4'-biphenyl epoxy resins, polyfunctional epoxy resins, divinylbenzene dioxide, and 2-glycidylphenylglycidyl ether. When resins, including aromatic, aliphatic and cycloaliphatic resins are described throughout the specification and claims, either the specifically-named resin or molecules having a moiety of the named resin are envisioned.

Also useful are aliphatic epoxy resins that may be used as flexibilizers in the formulation. These include aliphatic epoxy resins, such as butane dioldiglycidyl ether and siloxane resins.

Boron-Containing Catalysts

A second component of the encapsulant of the present invention is a boron-containing catalyst that is essentially free of halogen. The term essentially free of halogen means that halogen is not present in the boron catalyst or present in such minute quantities that the encapsulant end product is not substantially discolored by the presence of minute quantities of halogen. Such catalysts include those of structures 1 and 2:

wherein $R^1$—$R^3$ are $C_{1-20}$ aryl, alkyl or cycloalkyl residues and substituted derivatives thereof or $C_{1-20}$ aryloxy, alkyloxy or cycloalkoxy residues and substituted derivatives thereof. Particular examples of the aforementioned catalysts are triphenylborate, tributylborate, trihexylborate, tricyclohexylborate, triphenylboroxine, trimethylboroxine, tributylboroxine, trimethoxyboroxine, and tributoxyboroxine.

Other possible curing agents or catalysts include those mentioned in "Chemistry and Technology of the Epoxy Resins," B. Ellis (Ed.) Chapman Hall 1993, New York and "Epoxy Resins Chemistry and Technology," C. May and Y. Tanaka, Marcell Dekker 1972, New York.

It is also envisioned that for compositions comprising extremely reactive boron-containing catalysts, such as trialkoxyboroxines, that a cure-inhibitor can be optionally included. Cure inhibitors include compounds containing heteroatoms that possess lone electron pairs. Specific examples of cure inhibitors include alcohols such as polyfunctional alcohols such as diols, triols, etc., and bisphenols, trisphenols, etc. Further, the alcohol group in such compounds may be primary, secondary or tertiary and preferably secondary or tertiary type alcohol groups. Representative examples include benzyl alcohol, cyclohexanemethanol, cyclohexanedimethanol, and hexanediol. Phosphites, may also be used as cure inhibitors. Examples of phosphites are trialkylphosphite, triarylphophites, trialkyithiophosphite, triarlythioposhites, sterically hindered amines, and 2,2,6,6-tetramethylpiperidyl residues such as for example bis(2,2, 6,6-tetramethylpiperidyl) sebacate.

Also useful in the present invention are thermal stabilizers, which reduce color formation during processing of the encapsulant. Thermal stabilizers may also serve as UV stabilizers. Many stabilizers are known to improve the thermal and or UV stability and have been described in numerous publications such as J. F. Rabek, "Photostabilization of Polymers; Principles and Applications", Elsevier Applied Science, NY, 1990 and "Plastics Additives Handbook, 4th Edition" by R. Gachter and H. Muller (eds.) P. P. Klemchuck (assoc. ed.) Hansen Publishers, New York 1993, incorporated herein by reference.

These include organic phosphites and phosphonites, for example, triphenyl phosphite, diphenylalkyl phosphites, phenyldialkyiphosphites, tri-(nonylphenyl) phosphite, trilauryl phosphite, trioctadecyl phosphite, di-stearylpentaerythritoldiphosphite, tris-(2,4-di-tert-butylphenyl) phosphite, diisodecylpentaerythritol diphosphite, di-(2,4-di-tertbutylphenyl) pentaerythritol diphosphite, tristearyl-sorbitol triphosphite, tetrakis-(2,4-di-tert-butylphenyl), 4,4-diphenylylenediphosphonite, trismethylthiophosphite, trisethylthiophosphite, trispropylthiophosphite, trispentylthiophosphite, trishexylthiophosphite, trisheptyithiophosphite, trisoctylthiophosphite, trisnonylthiophosphite, trislaurylthiophosphite, trisphenylthiophosphite, trisbenzylthiophosphite, trisphenoxythiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite.

Thermal and/or oxidative stabilizers also include sterically hindered amines, for example bis-(2,2,6,6-tetramethylpiperidyl) sebacate, bis-(1,2,2,6,6-pentamethylpiperidyl) sebacate, n-butyl-3,5-di-tert.butyl-4-hydroxybenzyl malonic acid bis-(1,2,2,6,6-pentanemethylpiperidyl)ester, N,N'-(2,2,6,6-tetramethylpiperidyl)-hexamethylenediamine, 4-tert-octylamino-2,6-dichloro-s-triazine, tris-(2,2,6,6-tetramethylpiperidyl)-nitrilotriacetate, tetrakis-(2,2,6,6-tetramethyl-4-piperidyl) 1,2,3,4-butanetetracarboxylate, 1,1' (1,2-ethanediyl)-bis-(3,3,5,5-tetramethylpiperazinone), and condensation products of 1-hydroxyethyl-2,2,6,6-tetramethyl-4-hydroxypiperidine and succinic acid.

Other compounds useful as thermal stabilizers are esters of β-thiodipropionic acid, for example the lauryl, stearyl, myristyl or tridecyl esters, mercapto-benzimidazole or the zinc salt of 2-mercaptobenzimidazole, zinc dibutyl-dithiocarbamate, dioctadecyl disulfide, and pentaerythritol tetrakis-(beta- dodecylmercapto)-propionate.

Also useful in the present invention are coupling agents that help the epoxy resin bind to a glass matrix so as to form a strong bond to the surface such that premature failure is avoided. These include compounds that contain both siloxane and epoxy moieties. Examples of the silane coupling agents are mercaptomethyltriphenylsilane, β-mercaptoethyltriphenylsilane, β-mercaptopropyltriphenylsilane, γ-mercaptopropyldiphenylmethylsilane, γ-mercaptopropylphenyldimethylsilane, δ-mercaptobutylphenyldimethylsilane, δ-mercaptobutyltriphenylsilane, tris(β-mercaptoethyl) phenylsilane, tris(γ-mercaptopropyl)phenylsilane, tris(γ-mercaptopropyl)methylsilane, tris(γ-mercaptopropyl) ethylsilane, and tris(γ-mercaptopropyl)benzylsilane. These compounds can be used singly or in a combination of at least two compounds.

Refractive indexmodifiers may also be used with the present invention. As light passes from the relatively high index of a diffraction chip (2.8–3.2) to the lower refractive index epoxy encapsulant (1.2–1.6) some of the light is reflected back to the chip. Modifiers with a high refractive index added to the epoxy allow its refractive index to increase, producing a better match of the two refractive indices, which produces a reduction in the amount of reflective light and a consequential increase in the amount of emitted light. Preferred materials increase the refractive index of the epoxy without significantly effecting the transparency of the epoxy encapsulant. These materials include optically transparent organics or inorganics that can agglomerate into nanoparticles or structures whose size is less than the size of the wavelength of the visible light. Such materials include a variety of transparent metal oxides or group II–VI materials. These materials tend to be substantially free from scattering. In one embodiment, the nanoparticle material is titanium dioxide ($TiO_2$). In other embodiments, other types of transparent metal oxides or combinations of metal oxides can be used. For example, magnesium oxide (MgO), yttria ($Y_2O_3$), zirconia ($ZrO_2$), cerium oxide ($CeO_x$), alumina ($Al_2O_3$), lead oxide ($PbO_x$), and a composite material of yttria and zirconia can be used to produce the nanoparticles. In yet other embodiments, the nanoparticles are made from one of the group II–VI materials including zinc selenide (ZnSe), and zinc sulphide (ZnS). Alternatively, gallium nitride (GaN), silicon nitride (SiN), or aluminum nitride (AlN) can be also used to make the nanoparticles.

EXAMPLE 1

Epoxy Resin encapsulants were prepared by combining the epoxy resins and curing agents as shown in Table 1 and cured under the specified conditions.

TABLE 1

Comparison of anhydride and trimethoxyboroxine cured epoxy resins.

|  | Example | | Comparative Example | | |
|---|---|---|---|---|---|
|  | 1 | 2 | 1 | 2 | 3 |
| Component A |  |  |  |  |  |
| ERL 4221* | 96 | 94 | 60 | 59.4 | 61.1 |
| Component B |  |  |  |  |  |
| Methyl Hexahydrophthalic Anhydride |  |  | 40 | 39.6 |  |
| Hexahydrophthalic Anhydride |  |  |  |  | 38.9 |
| Trimethoxyboroxine | 2 | 2 |  |  |  |
| Zinc Octoate |  |  |  | 1 |  |
| Component C |  |  |  |  |  |
| Triphenylphosphite | 2 | 4 |  |  |  |
| Cure Conditions: | A | A | B | B | B |
| Yellowness Index** | 3.62 | 3.88 | 21.30 | 35.20 | 8.55 |

ERL 4221 is 3,4-epoxycyclohexylmethyl-3,4-epoxycyclohexanecarboxylate, manufactured by Union Carbide. The Yellowness Index is a standard ASTM test. Cure condition A: components were cured overnight (around 16 hours) at room temperature (around 25° C.), and then were postcured at 150° C. for 2 hours. Components B and C were first mixed, and then subsequently mixed with components A. Cure condition B: components were cured at 150° C. for 3 hours. Samples were made by forming a disk of approximately two inches in diameter and a length of 1 cm were tested using a UV-VIS spectrometer. As shown in Table 2, boroxine cured cycloaliphatic epoxy resins have improved transmission characteristics over anhydride cured epoxy resins, in the spectral regions between 400 and 530 nm. This makes these encapsulants particularly suited for LEDs requiring transmission of blue and/or green light.

EXAMPLE 2

LED devices are prepared by encapsulating LED lead frames containing a phosphor with the epoxy resin compositions of Table 1. The low absorbance of the encapsulants 1 and 2 (Table 1) in the blue and green regions will produce LEDs with higher emissions in these regions

TABLE 3

Addition trimethoxyboroxine cured epoxy resin.

| Example | 3 | 4 | 5 | 6 | 7 | 8 |
|---|---|---|---|---|---|---|
| Component A |  |  |  |  |  |  |
| ERL 4221 | 96 | 94 |  | 93.5 | 95 | 76.8 |
| CY 175 |  |  | 94 |  |  |  |
| Component B |  |  |  |  |  |  |
| Trimethoxyboroxine | 2 | 2 | 2 | 2 | 2 | 7.9 |
| Component C |  |  |  |  |  |  |
| Triphenylphosphite |  | 2 | 2 | 4 | 2 |  |

TABLE 2

Comparison of absorbance of anhydride and trimethoxyboroxine cured epoxy resins.

|  | Example | | Comparative Example | | |
|---|---|---|---|---|---|
| Wavelength (nm) | 1 Absorbance (AU/cm) | 2 Absorbance (AU/cm) | 1 Absorbance (AU/cm) | 2 Absorbance (AU/cm) | 3 Absorbance (AU/cm) |
| 360 | 0.2751 | 0.3205 | 1.2525 | 1.3864 | 0.8631 |
| 360 | 0.1878 | 0.2194 | 1.0466 | 1.6380 | 0.5822 |
| 380 | 0.1373 | 0.1642 | 0.7594 | 1.7874 | 0.3860 |
| 390 | 0.1103 | 0.1322 | 0.5613 | 1.5950 | 0.2760 |
| 400 | 0.0948 | 0.1118 | 0.4305 | 1.1900 | 0.2128 |
| 410 | 0.0853 | 0.0981 | 0.3394 | 0.8588 | 0.1733 |
| 420 | 0.0781 | 0.0878 | 0.2747 | 0.6257 | 0.1464 |
| 430 | 0.0726 | 0.0799 | 0.2259 | 0.4600 | 0.1269 |
| 440 | 0.0682 | 0.0741 | 0.1905 | 0.3466 | 0.1130 |
| 450 | 0.0648 | 0.0696 | 0.1629 | 0.2668 | 0.1024 |
| 460 | 0.0623 | 0.0663 | 0.1420 | 0.2102 | 0.0944 |
| 470 | 0.0597 | 0.0633 | 0.1250 | 0.1709 | 0.0875 |
| 480 | 0.0579 | 0.0613 | 0.1124 | 0.1418 | 0.0829 |
| 490 | 0.0566 | 0.0597 | 0.1011 | 0.1197 | 0.0783 |
| 500 | 0.0552 | 0.0582 | 0.0926 | 0.1033 | 0.0749 |
| 510 | 0.0541 | 0.0572 | 0.0862 | 0.0916 | 0.0725 |
| 520 | 0.0532 | 0.0563 | 0.0812 | 0.0828 | 0.0706 |
| 530 | 0.0524 | 0.0555 | 0.0770 | 0.0762 | 0.0689 |

TABLE 3-continued

Addition trimethoxyboroxine cured epoxy resin.

| Example | 3 | 4 | 5 | 6 | 7 | 8 |
|---|---|---|---|---|---|---|
| Component D | | | | | | |
| Glycidoxypropyltrimethoxy silane | 2 | 2 | 2 | 0.5 | | |
| Component E | | | | | | |
| Benzyl Alcohol | | | | | 1 | 15.3 |
| Cure Conditions | C | C | C | B | B | D |
| Yellowness Index | 4.73 | 4.61 | 2.40 | 3.62 | 3.545 | 1.57 |

CY 175 is 2-(3,4-epoxy)cyclohexyl-5,5-spiro-(3,4-epoxy)cyclohexane-m-dioxane, made by Ciba. Cure condition B: 150° C. for 3 hours. Cure condition C: components were cured overnight (around 16 hours) at room temperature (around 25° C.), and then were postcured at 100° C. for 2 hours and at 150° C. for 2 hours. Cure condition D: components were cured overnight (around 16 hours) at room temperature (around 25° C.), and then postcured for 3 hours at 150° C.

Figure 1:
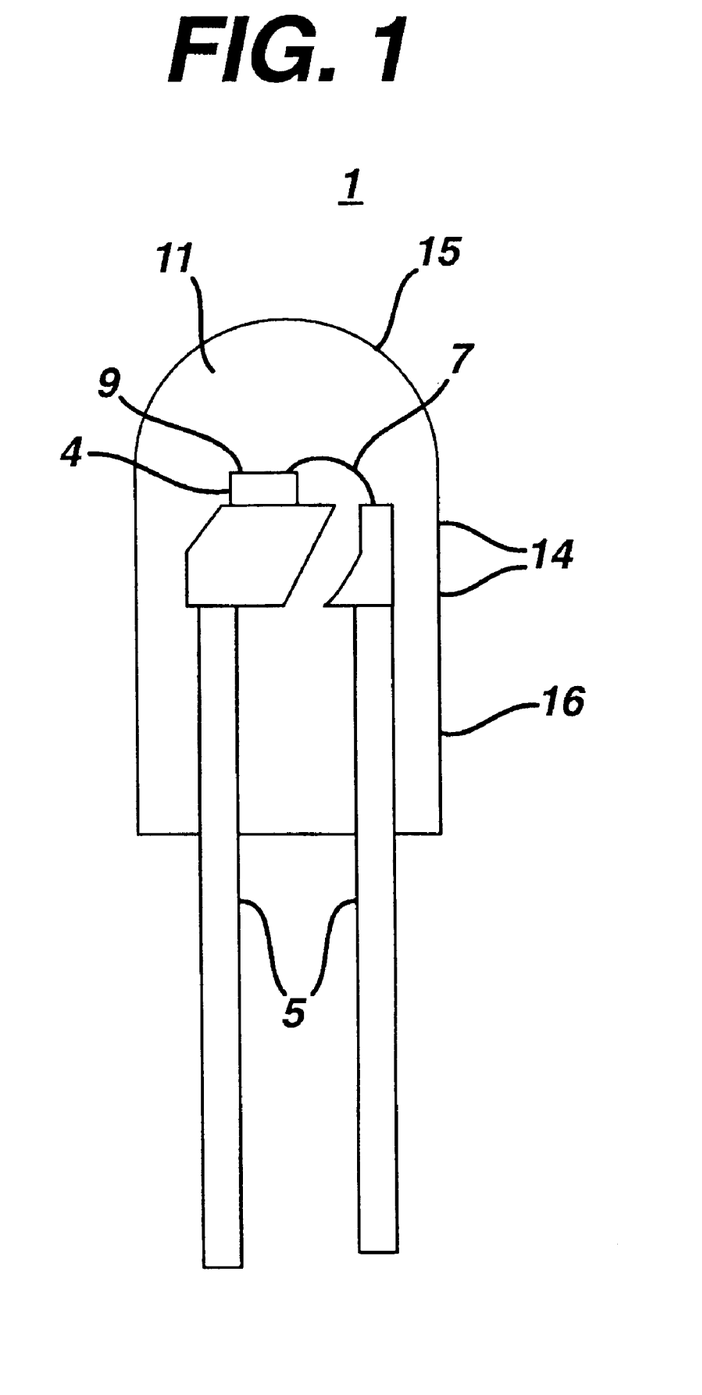
FIG. 1 is a schematic illustration of a LED according to one preferred embodiment of the present invention.

FIG. 1 schematically illustrates a LED 1 according to one preferred embodiment of the present invention. The LED 1 contains a LED chip 4, which is electrically connected to a lead frame 5. For example, the LED chip 4 may be directly electrically connected to an anode or cathode electrode of the lead frame 5 and connected by a lead 7 to the opposite cathode or anode electrode of the lead frame 5, as illustrated in FIG. 1. In the preferred embodiment illustrated in FIG. 1, the lead frame 5 supports the LED chip 4. However, the lead 7 may be omitted, and the LED chip 4 may straddle both electrodes of the lead frame 5 with the bottom of the LED chip 4 containing the contact layers, which contact the both the anode and cathode electrode of the lead frame 5. Alternatively, the LED chip 4 may be connected with a separate lead 7 to the cathode and the anode electrode of the lead frame 5. The lead frame 5 connects to a power supply, such as a current or voltage source or to another circuit (not shown).

The LED chip 4 emits radiation from the radiation emitting surface 9. The LED may emit visible, ultraviolet or infrared radiation. The LED chip may comprise any LED chip containing a p–n junction of any semiconductor layers capable of emitting the desired radiation. For example, the LED chip may contain any desired III–V compound semiconductor layers, such as GaAs, GaAlAs, GaN, InGaN, GaP, etc., or II–VI compound semiconductor layers such ZnSe, ZnSSe, CdTe, etc., or IV–IV semiconductor layers such as SiC. The LED chip 4 may also contain other layers, such as cladding layers, waveguide layers and contact layers.

The LED 1 is packaged with the encapsulant 11 of the present invention. An alternative term for encapsulant is the encapsulating material. Preferably, the LED packaging includes encapsulant 11 located in a package, such as a shell 14. The shell may be any plastic or other material, such as polycarbonate, which is transparent to the LED radiation. However, the shell 14 may be omitted to simplify processing if the encapsulant 11 has sufficient toughness and rigidity to be used without a shell. Thus, the outer surface of the encapsulant 11 would act as a shell 14 or package. The shell 14 contains a light or radiation emitting surface 15 above the LED chip 4 and a non-emitting surface 16 adjacent to the lead frame 5. The radiation emitting surface 15 may be curved to act as a lens and/or may be colored to act as a filter. The non-emitting surface 16 may be opaque to the LED radiation, and may be made of opaque materials, such as metal. The shell 14 may also contain a reflector around the LED chip 4, or other components, such as resistors, etc., if desired.

Furthermore, one or both encapsulating materials may optionally contain a phosphor to optimize the color output of the LED 1. For example, the phosphor may be interspersed or mixed as a phosphor powder with the encapsulant 11 or coated as a thin film on the LED chip 4 or coated on the inner surface of the shell 14. Any phosphor material may be used with the LED chip. For example, a yellow emitting cerium doped yttrium aluminum garnet phosphor (YAG:Ce$^{3+}$) may be used with a blue emitting InGaN active layer LED chip to produce a visible yellow and blue light output which appears white to a human observer. Of course, other combinations of LED chips and phosphors may be used as desired.

While the packaged LED chip 4 according to the preferred embodiment illustrated in FIG. 1 is supported by the lead frame 5, the LED 1 can have various other structures. For example, the LED chip 4 may be supported by the bottom surface 16 of the shell 14 or by a pedestal (not shown) located on the bottom of the shell 14, instead of by the lead frame 5.

Figure 2:
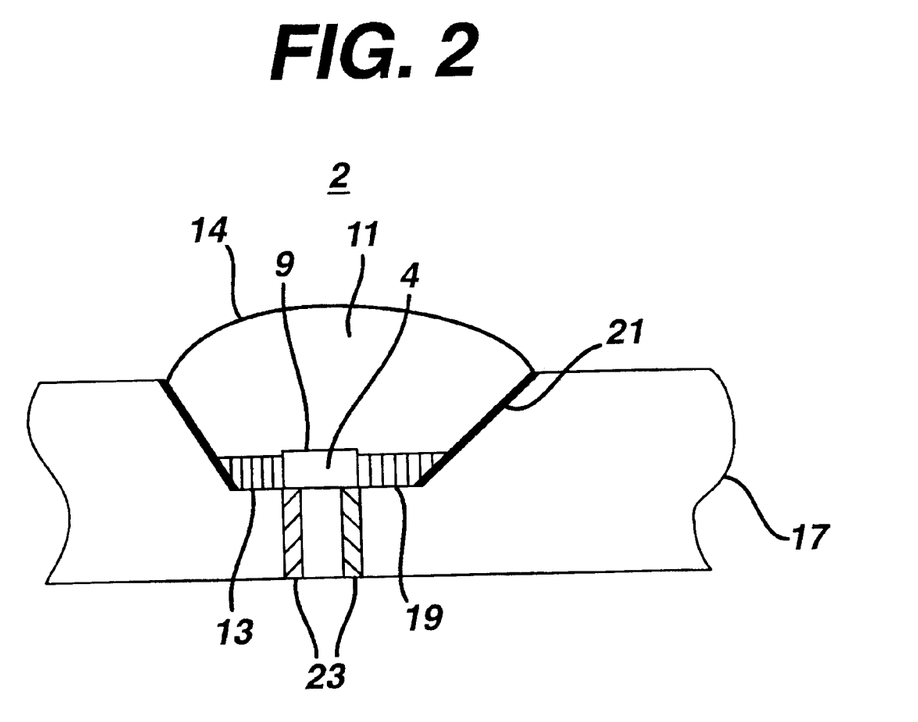
FIG. 2 is a schematic illustration of a LED according to another preferred embodiment of the present invention.

In an alternative embodiment of the present invention, the LED chip 4 of the LED 2 may be supported by a carrier substrate 17, as illustrated in FIG. 2. The carrier substrate 17 comprises a lower portion of the LED package, and may comprise any material, such as plastic, metal or ceramic. Preferably, the carrier substrate is made out of plastic and contains a groove 19 in which the LED chip 4 is located. The sides of the groove 19 may be coated with a reflective metal 21, such as aluminum, which acts as a reflector. However, the LED chip 4 may be formed over a flat surface of the substrate 17. The substrate 17 contains electrodes 23 that electrically contact the contact layers of the LED chip 4. Alternatively, the electrodes 23 may be electrically connected to the LED chip 4 with one or two leads as illustrated in FIG. 1. If desired, the shell 14 or a glass plate may be formed over the encapsulant 11 to act as a lens or protective material.

Figure 3:
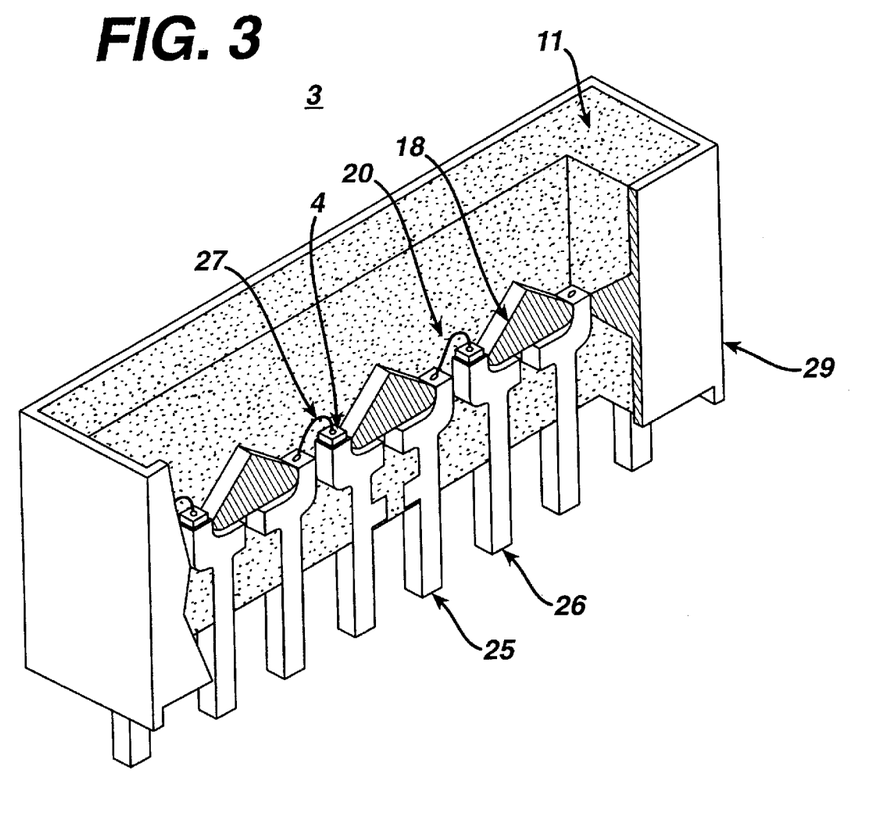
FIG. 3 is a schematic illustration of a LED according to another preferred embodiment of the present invention.

In another embodiment of the present invention is a LED array 3 fabricated on a plastic substrate, as illustrated in FIG. 3. The LED chips or die 4 are physically and electrically mounted on cathode leads 26. The top surfaces of the LED chips 4 are electrically connected to anode leads 25 with lead wires 27. The lead wires are attached by known wire bonding techniques to a conductive chip pad. The leads 26, 25 comprise a lead frame and may be made of a metal, such as silver plated copper. The lead frame and LED chip array 3 are contained in a plastic package 29, such as a LEXAN® package. The plastic package 29 is filled with the encapsulant 11 of the present invention. The package 29 contains tapered interior sidewalls 18, which enclose the LED chips 4, and form a light spreading cavity 20, which ensures cross fluxing of LED light.

We claim:

1. A packaged solid state device comprising:
   (a) a package;
   (b) a chip; and
   (c) an encapsulant comprising:
      (i) an epoxy resin in an amount of from about 76% to about 99% by weight of the encapsulant; and
      (ii) a boron containing curing agent in an amount of from about 1% to about 24% by weight of the encapsulant, wherein the curing agent is essentially free of halogen.

2. A packaged solid state device according to claim 1, wherein the solid state device is a semiconductor device.

3. A packaged solid state device according to claim 1, wherein the solid state device is an opto-electronic device.

4. A packaged solid state device according to claim 3, wherein the opto-electronic device is a semiconductor device comprising: a LED, CCD, LSI, photo diode, photo transistor, or opto-electronic coupler.

5. A packaged solid state device according to claim 1, wherein the package comprises a shell or lens.

6. A packaged solid state device according to claim 1, wherein the encapsulate is from about 85% to about 99% by weight epoxy resin and from about 1% to about 15% by weight curing agent.

7. A packaged solid state device according to claim 1, wherein the epoxy resin is aromatic.

8. A packaged solid state device according to claim 7, wherein the epoxy resin is at least one member selected from the group consisting of: bisphenol-A epoxy resins, bisphenol-F epoxy resins, phenol novolac epoxy resins, cresol-novolac epoxy resins, biphenol epoxy resins, 4,4'-biphenyl epoxy resins, cyclopentadiene- epoxy resins, divinylbenzene dioxide, 2-glycidylphenylglycidyl ether, and phenol pentadiene.

9. A packaged solid state device according to claim 1, wherein the epoxy resin is aromatic.

10. A packaged solid state device according to claim 9, wherein the cycloaliphatic epoxy resin is at least one member selected from the group consisting of: 2-(3,4-epoxy)cyclohexyl-5,5-spiro-(3,4-epoxy)cyclohexane-m-dioxane, 3,4-epoxycyclohexylmethyl-3,4-epoxycyclohexanecarboxylate, 3,4-epoxy-6-methylcyclohexylmethyl-3,4epoxy-6-methylcyclohexanecarboxylate, vinyl, cyclohexane dioxide, bis(3,4-epoxycylohexylmethyl)adipate, bis(3,4 epoxy-6-methylcyclohexylmethyl)-adipate, exo-exo bis(2,3-epoxycyclopentyl) ether, endo-exo bis(2,3-epoxycyclopentyl) ether, 2,2-bis(4-(2,3-epoxypropoxy)cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)hexahydro-4,7-methanoindane, p-(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy)cyclopentylphenyl-2,3-epoxy-propyl ether), 1,2-bis(5-(1,2-epoxy)-4,7-hexahydromethanoindanoxyl)ethane, cyclopentenylphenyl glycidyl ether, cyclohexanediol diglycidyl ether, and diglycidyl hexahydrophthalate.

11. A packaged solid state device according to claim 10, wherein the cycloaliphatic epoxy resin is at least one member selected from the group consisting of: 3,4-epoxycyclohexylmethyl-3,4-epoxycyclohexanecarboxylate or 3,4-epoxy-6-methylcyclohexylmethyl-3,4-epoxy-6-methylcyclohexane-carboxylate, and 5-spiro-(3,4-epoxy) cyclohexane-m-dioxane.

12. A packaged solid state device according to claim 1, wherein the boron containing curing agent is a borate.

13. A packaged solid state device according to claim 12, wherein the borate has the following structure:

wherein $R^1$—$R^3$ are $C_{1-20}$ aryl, alkyl, or cycloalkyl residues and substituted derivatives thereof, or $C_{1-20}$ aryloxy, alkyloxy or cycloalkoxy residues and substituted derivatives thereof.

14. A packaged solid state device according to claim 13, wherein the borate is at least one member selected from the group consisting of: triphenylborate, tributylborate, trihexylborate, and tricyclohexylborate.

15. A packaged solid state device according to claim 1, wherein the boron containing curing agent is a boroxine.

16. A packaged solid state device according to claim 15, wherein the boroxine has the following structure:

wherein $R^1$—$R^3$ are $C_{1-20}$ aryl, alkyl or cycloalkyl residues and substituted derivatives thereof, or $C_{1-20}$ aryloxy, alkyloxy or cycloalkoxy residues and substituted derivatives thereof.

17. A packaged solid state device according to claim 16, wherein the boroxine is at least one member selected from the group consisting of: triphenylboroxine, trimethylboroxine, tributylboroxine, trimethoxyboroxine, and tributoxyboroxine.

18. A packaged solid state device according to claim 1, further comprising a thermal stabilizer.

19. A packaged solid state device according to claim 18, wherein the thermal stabilizer is a phosphite or phosphonite compound.

20. A packaged solid state device according to claim 19, wherein the thermal stabilizer is at least one phosphite or phosphonite compound selected form the group consisting of: triphenyl phosphite, diphenylalkyl phosphites, phenyldialkyiphosphites, tri-(nonylphenyl) phosphite, trilauryl phosphite, trioctadecyl phosphite, di-stearylpentaerythritoldiphosphite, tris-(2,4-di-tert-butylphenyl) phosphite, diisodecylpentaerythritol diphosphite, di-(2,4-di-tertbutylphenyl) pentaerythritol diphosphite, tristearyl-sorbitol triphosphite, tetrakis-(2,4-di-tert-butylphenyl), 4,4-diphenylylenediphosphonite, trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, trisphenoxythiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite.

21. A packaged solid state device according to claim 20, wherein the thermal stabilizer is a sterically hindered amine.

22. A packaged solid state device according to claim 21, wherein the thermal stabilizer is at least one member selected from the group consisting of: bis-(2,2,6,6-tetramethylpiperidyl) sebacate, bis-(1,2,2,6,6-pentamethylpiperidyl) sebacate, n-butyl-3,5-di-tert.butyl-4-hydroxybenzyl malonic acid bis-(1,2,2,6,6-pentanemethylpiperidyl)ester, condensation product of 1-hydroxyethyl-2,2,6,6-tetramethyl-4-hydroxypiperidine and succinic acid, condensation product of N,N'-(2,2,6,6-tetramethylpiperidyl)-hexamethylenediamine and 4-tert-octyl-amino-2,6-dichloro-s-triazine, tris-(2,2,6,6-tetramethylpiperidyl)-nitrilotriacetate, tetrakis-(2,2,6,6-tetramethyl-4-piperidyl) 1,2,3,4-butanetetracarboxylate, and 1,1'(1,2-ethanediyl)-bis-(3,3,5,5-tetramethylpiperazinone).

23. A packaged solid state device according to claim 1, further comprising a refractive index modifier.

24. A packaged solid state device according to claim 23, wherein the refractive index modifier is a transparent metal oxide or transparent group II–VI material.

25. A packaged solid state device according to claim 24, wherein the refractive index modifier is at least one member selected from the group consisting of: titanium dioxide, magnesium oxide (MgO), yttria ($Y_2O_3$), zirconia ($ZrO_2$), cerium oxide ($CeO_x$), alumina ($Al_2O_3$), lead oxide ($PbO_x$), a yttria and zirconia composite material, zinc selenide (ZnSe), zinc sulphide (ZnS), $Zn_xSe_yYS_zTe_w$, gallium nitride (GaN), silicon nitride (SiN), and aluminum nitride (AlN).

26. A packaged solid state device according to claim 1, further comprising a coupling agent.

27. A packaged solid state device according to claim 26, wherein the coupling agent is at least one member selected from the group consisting of: mercaptomethyltriphenylsilane, β-mercaptoethyltriphenylsilane, γ-mercaptopropyltriphenylsilane, γ-mercaptopropyldiphenylmethylsilane, γ-mercaptopropylphenyldimethylsilane, δ-mercaptobutylphenyldimethylsilane, δ-mercaptobutyltriphenylsilane, tris(β-mercaptoethyl) phenylsilane, tris(γ-mercaptopropyl)phenylsilane, tris(γ-mercaptopropyl)methylsilane, tris(γ-mercaptopropyl) ethylsilane, and tris(γ-mercaptopropyl)benzylsilane.

28. A packaged solid state device according to claim 26, wherein the coupling agent is at least one member selected from the group consisting of: compounds that contain both siloxane and epoxy moieties.

29. A packaged solid state device of claim 1 in which the encapsulant has been cured.

30. A packaged solid state device according to claim 1, further comprising a cure inhibitor.

31. A packaged solid state device according to claim 30, wherein the cure inhibitor is at least one member selected from the group consisting of polyfunctional alcohols, diols, triols, bisphenols, trisphenols; primary alcohols, secondary alcohols, tertiary alcohols; benzyl alcohol, cyclohexanemethanol, cyclohexanedimethanol, and hexanediol.

32. A packaged solid state device according to claim 1, wherein the encapsulant has an average absorbance in the range of 400–450 nanometers of less than 0.1 absorbance units per centimeter.

33. A LED device comprising:
(a) a package;
(b) a LED chip; and
(c) an encapsulant comprising:
  (i) a cycloaliphatic epoxy resin in an amount of from about 76% to about 99% by weight of the encapsulant; and
  (ii) a boroxine curing agent in an amount of from about 1% to about 24% by weight of the encapsulant, wherein the curing agent is essentially free of halogen.

34. A LED device according to claim 33, wherein the epoxy resin is from about 85% to about 99% by weight and the curing agent is from about 1% to about 15% by weight.

35. A LED device according to claim 32, wherein the cycloaliphatic epoxy resin is at least one member selected from the group consisting of: 2-(3,4-epoxy)cyclohexyl-5,5-spiro-(3,4-epoxy)cyclohexane-m-dioxane, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, vinyl cyclohexane dioxide, bis(3,4-epoxycyclohexylmethyl)adipate, bis(3,4-epoxy-6-methylcyclohexylmethyl)adipate, exo-exo bis(2,3-epoxycyclopentyl) ether, endo-exo bis(2,3-epoxycyclopentyl) ether, 2,2-bis(4-(2,3-epoxypropoxy) cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)hexahydro-4,7-methanoindane, p-(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy)-cyclopentylphenyl-2,3-epoxypropyl ether), 1,2-bis(5-(1,2-epoxy)-4,7-hexahydromethandindanoxyl)ethane, cyclopentenylphenyl glycidyl ether, cyclohexanediol diglycidyl ether, and diglycidyl hexahydrophthalate.

36. A LED device according to claim 35, wherein the cycloaliphatic epoxy resin is at least one member selected from the group consisting of: 3,4-epoxycyclohexylmethyl-3,4-epoxycyclohexanecarboxylate, or 3,4-epoxy-6-methylcyclohexylmethyl-3,4-epoxy-6-methylcyclohexanecarboxylate, and 5-spiro-(3,4-epoxy) cyclohexane-m-dioxane.

37. A LED device according to claim 35, wherein the boroxine containing curing agent has the following structure:

wherein $R^1$—$R^3$ are $C_{1-20}$ aryl, alkyl or cycloalkyl residues and substituted derivatives thereof, or $C_{1-20}$ aryloxy, alkyloxy or cycloalkoxy residues and substituted derivatives thereof.

38. A LED device according to claim 37, wherein the boroxine is at least one member selected from the group consisting of: triphenylboroxine, trimethylboroxine, tributylboroxine, trimethoxyboroxine, and tributoxyboroxine.

39. A LED device according to claim 37, further comprising a thermal stabilizer.

40. A LED device according to claim 39, wherein the thermal stabilizer is at least one phosphite or phosphonite selected from the group consisting of: triphenyl phosphite, diphenylalkyl phosphites, phenyldialkylphosphites, tri-(nonylphenyl) phosphite, trilauryl phosphite, trioctadecyl phosphite, di-stearylpentaerythritoldiphosphite, tris-(2,4-di-tert-butylphenyl) phosphite, diisodecylpentaerythritol diphosphite, di-(2,4-di-tertbutylphenyl) pentaerythritol diphosphite, tristearyl-sorbitol triphosphite, tetrakis-(2,4-di-tert-butylphenyl), 4,4-diphenylylenediphosphonite, trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, trisphenoxythiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite.

41. A LED device according to claim 37, further comprising a refractive index modifier.

42. A LED device according to claim 41, wherein the refractive index modifier is at least one member selected from the group consisting of: titanium dioxide, magnesium oxide (MgO), yttria ($y_2O_3$), zirconia ($ZrO_2$), cerium oxide ($CeO_x$), alumina ($Al_2O_3$), lead oxide ($PbO_x$), a yttria and zirconia composite material, zinc selenide (ZnSe), zinc sulphide (ZnS), $Zn_xSe_yS_zTe_w$, gallium nitride (GaN), silicon nitride (SiN), and aluminum nitride (AlN).

43. A LED device according to claim 37, further comprising a cure inhibitor.

44. A LED device according to claim 43, wherein the cure inhibitor is at least one member selected from the group consisting of polyfunctional alcohols, diols, triols, bisphenols, trisphenols; primary alcohols, secondary alcohols, tertiary alcohols; benzyl alcohol, cyclohexanemethanol, cyclohexanedimethanol, and hexanediol.

45. A LED device according to claim 37, further comprising a coupling agent.

46. A LED device according to claim 45, wherein the coupling agent is at least one member selected from the group consisting of: compounds that contain both siloxane and epoxy moieties.

47. A LED device according to claim 37, wherein the encapsulant has an average absorbance in the range of 400–450 nanometers of less than 0.1 absorbance units per centimeter.

48. A LED device according to claim 33, wherein the curing agent is at least one member selected from the group consisting of: triphenylboroxine, trimethylboroxine, tributylboroxine, trimethoxyboroxine, and tributoxyboroxine.

49. A LED device of claim 33, in which the encapsulant has been cured.

50. A method of encapsulating a solid state device comprising:
    placing a solid state device into a package; and
    providing an encapsulant comprising:
        (i) an epoxy resin in an amount of from about 76% to about 99% by weight of the encapsulant; and
        (ii) a boron containing curing agent in an amount of from about 1% to about 24% by weight of the encapsulant, wherein the curing agent is essentially free of halogen.

51. A method according to claim 50, wherein the solid state device is a LED, the package is a shell or lens, the epoxy resin is cycloaliphatic or aliphatic, and the boron containing curing agent is a boroxine or a borate.

52. A method according to claim 51, wherein the cycloaliphatic epoxy resin is at least one member selected from the group consisting of: 2-(3,4-epoxy)cyclohexyl-5,5-spiro-(3,4-epoxy)cyclohexane-m-dioxane, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, vinyl cyclohexane dioxide, bis(3,4-epoxycyclohexylmethyl)adipate, bis(3,4-epoxy-6-methylcyclohexylmethyl)adipate, exo-exo bis(2,3-epoxycyclopentyl) ether, endo-exo bis(2,3-epoxycyclopentyl) ether, 2,2-bis(4-(2,3-epoxypropoxy)cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)-hexahydro-4,7-methanoindane, p-(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy)cyclopentylphenyl-2,3-epoxypropyl ether), 1,2-bis(5-(1,2-epoxy)-4,7-hexahydromethanoindanoxyl)ethane, cyclopentenylphenyl glycidyl ether, cyclohexanediol diglycidyl ether, and diglycidyl hexahydrophthalate.

53. A method according to claim 51, wherein the curing agent comprises a boroxine having the following structure:

wherein $R^1$—$R^3$ are $C_{1-20}$ aryl, alkyl or cycloalkyl residues and substituted derivatives thereof, or $C_{1-20}$ aryloxy, alkyloxy or cycloalkoxy residues and substituted derivatives thereof.

54. A method according to claim 53, wherein the boroxine is at least one member selected from the group consisting of: triphenylboroxine, trimethylboroxine, tributylboroxine, trimethoxyboroxine, and tributoxyboroxine.

55. A method according to claim 51, wherein the curing agent comprises a borate having the following structure:

wherein $R^1$—$R^3$ are $C_{1-20}$ aryl, alkyl, or cycloalkyl residues and substituted derivatives thereof, or $C_{1-20}$ aryloxy, alkyloxy or cycloalkoxy residues and substituted derivatives thereof.

56. A method according to claim 55, wherein the borate is at least one member selected from the group consisting of: triphenylborate, tributylborate, trihexylborate, and tricyclohexylborate.

57. A method according to claim 50, wherein the encapsulant further comprises at least one thermal stabilizer selected from the group consisting of a phosphite compound, a phosphonite compound, and a sterically hindered amine.

58. A method according to claim 57, wherein the encapsulant comprises at least one thermal stabilizer selected from the group consisting of: triphenyl phosphite, diphenylalkyl phosphites, phenyldialkylphosphites, tri-(nonylphenyl) phosphite, trilauryl phosphite, trioctadecyl phosphite, di-stearylpentaerythritoldiphosphite, tris-(2,4-di-tert-butylphenyl) phosphite, diisodecylpentaerythritol diphosphite, di-(2,4-di-tertbutylphenyl) pentaerythritol diphosphite, tristearyl-sorbitol triphosphite, tetrakis-(2,4-di-tert-butylphenyl), 4,4-diphenylylenediphosphonite, trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, trisphenoxythiophosphite, bispropiothiomethylphosphite, bispropiothiononylphosphite, bisnonylthiomethylphosphite, bisnonylthiobutylphosphite, methylethyl thiobutylphosphite, methylethylthiopropiophosphite, methylnonylthiobutylphosphite, methylnonylthiolaurylphosphite, and pentylnonylthiolaurylphosphite.

59. A method according to claim 50, wherein the encapsulant further comprises at least one cure inhibitor.

60. A method according to claim 59, wherein the cure inhibitor is at least one member selected from the group consisting of polyfunctional alcohols, diols, triols, bisphenols, trisphenols; primary alcohols, secondary alcohols, tertiary alcohols; benzyl alcohol, cyclohexanemethanol, cyclohexanedimethanol, and hexanediol.

61. A method according to claim 50, wherein the encapsulant further comprises at least one coupling agent.

62. A method according to claim 61, wherein the coupling agent is at least one member selected from the group consisting of: compounds that contain both siloxane and epoxy moieties.

63. A method according to claim 50, wherein the encapsulant further comprises at least one refractive index modifier selected from the group consisting of: a transparent metal oxide and a transparent group II–VI material.

64. A method according to claim 63, wherein the refractive index modifier is at least one member selected from the group consisting of: titanium dioxide, magnesium oxide (MgO), yttria ($Y_2O_3$), zirconia ($ZrO_2$), cerium oxide ($CeO_x$), alumina ($Al_2O_3$), lead oxide ($PbO_x$), a yttria and zirconia composite material, zinc selenide (ZnSe), zinc sulphide (ZnS), $Zn_xSe_yS_zTe_w$, gallium nitride (GaN), silicon nitride (SiN), and aluminum nitride (AlN).

65. A method according to claim 50, which further comprises curing the encapsulant.

* * * * *

UNITED STATES PATENT AND TRADEMARK OFFICE
CERTIFICATE OF CORRECTION

PATENT NO. : 6,507,049 B1
DATED : January 14, 2003
INVENTOR(S) : Gary William Yeager et al.

It is certified that error appears in the above-identified patent and that said Letters Patent is hereby corrected as shown below:

Column 1,
Line 4, insert the following heading and paragraph:
STATEMENT REGARDING FEDERALLY SPONSORED RESEARCH & DEVELOPMENT
This invention was first conceived or reduced to practice in the performance of work under contract 70NANB8H4022 with the United States National Institute of Standards and Technology (NIST). The United States of America may have certain rights to this invention.

Line 55, the phrase "an;uncured" should read -- an uncured --.

Column 4,
Line 13, the word "cycloalipahtic" should read -- cycloaliphatic - --.

Column 5,
Line 43, the word "triarylphophites" should read -- triarylphosphites --.
Line 43, the word "trialkyithiophosphite" should read -- trialkylthiophosphite --.
Line 44, the word "triarlythioposhites" should read -- triarylthiophosphites --.
Line 60, the word "phenyldialkyiphosphites" should read -- phenyldialkylphosphites --.

Column 6,
Line 1, the word "trisheptyithiophosphite" should read -- trisheptylthiophosphite --.
Line 46, the word "indexmodifiers" should read -- index modifiers --.
Line 39, the phrase "vinyl, cyclohexane" should read -- vinyl cyclohexane --.

Column 11,
Line 40, the word "bis(3,4-epoxycylohexylmethyl)adipate" should read -- bis(3,4-epoxycyclohexylmethyl)adipate --.

Column 12,
Line 44, the word "phenyldialkyiphosphites" should read -- phenyldialkylphosphites --.

UNITED STATES PATENT AND TRADEMARK OFFICE
CERTIFICATE OF CORRECTION

PATENT NO. : 6,507,049 B1
DATED : January 14, 2003
INVENTOR(S) : Gary William Yeager et al.

It is certified that error appears in the above-identified patent and that said Letters Patent is hereby corrected as shown below:

<u>Column 14,</u>
Lines 23-24, the word "1,2-bis(5-(1,2-epoxy)-4,7-hexahydromethandindanoxyl)ethane" should read -- 1,2-bis(5-(1,2-epoxy)-4,7-hexahydromethanoindanoxyl)ethane --.

Signed and Sealed this

Twenty-seventh Day of May, 2003

JAMES E. ROGAN
*Director of the United States Patent and Trademark Office*